(12) United States Patent  
Suzuki et al.

(10) Patent No.: US 7,924,574 B2  
(45) Date of Patent: Apr. 12, 2011

(54) HIGH-FREQUENCY CIRCUIT COMPONENTS

(75) Inventors: Yoshihiko Suzuki, Funabashi (JP); Hiroshi Konishi, Ichikawa (JP); Madoka Nishiyama, Yokohama (JP)

(73) Assignee: Nikon Corporation, Tokyo (JP)

( * ) Notice: Subject to any disclaimer, the term of this patent is extended or adjusted under 35 U.S.C. 154(b) by 170 days.

(21) Appl. No.: 12/326,793

(22) Filed: Dec. 2, 2008

(65) Prior Publication Data

US 2009/0084593 A1 Apr. 2, 2009

Related U.S. Application Data

(63) Continuation of application No. PCT/JP2007/059860, filed on May 14, 2007.

(30) Foreign Application Priority Data

Jun. 3, 2006 (JP) ................................ 2006-155497

(51) Int. Cl.
*H05K 1/11* (2006.01)

(52) U.S. Cl. ........ 361/792; 361/760; 361/765; 361/736; 361/749; 361/728; 174/260; 174/261

(58) Field of Classification Search .................. 361/684, 361/728, 729, 734, 736, 738, 748, 749, 760, 361/761, 763, 765, 766, 790, 792, 793, 795, 361/784, 679.01; 174/250, 254, 255, 260, 174/261

See application file for complete search history.

(56) References Cited

U.S. PATENT DOCUMENTS

| 6,067,183 A * | 5/2000 | Furlani et al. ................. 359/254 |
| 6,101,371 A | 8/2000 | Barber et al. |
| 7,259,649 B2 * | 8/2007 | Ancey et al. ................... 336/200 |
| 2004/0125432 A1 * | 7/2004 | Ishizuya et al. ............... 359/290 |
| 2004/0152276 A1 | 8/2004 | Nishimura |
| 2005/0045374 A1 * | 3/2005 | Kumar et al. ................. 174/254 |
| 2006/0055287 A1 * | 3/2006 | Kawakubo et al. ........... 310/348 |

FOREIGN PATENT DOCUMENTS

| JP | 2000-150251 | 5/2000 |
| JP | 2004-221285 | 8/2004 |
| JP | 2005-251549 | 9/2005 |
| WO | WO 03/060592 | 7/2003 |

OTHER PUBLICATIONS

International Search Report, dated Aug. 21, 2007, issued in corresponding International Application No. PCT/JP2007/059860.

* cited by examiner

*Primary Examiner* — Dameon E Levi  
*Assistant Examiner* — Hoa C Nguyen  
(74) *Attorney, Agent, or Firm* — Klarquist Sparkman, LLP

(57) ABSTRACT

High-frequency circuit components are disclosed in which parasitic capacitance between a high-frequency circuit element and a substrate is reduced and mechanical strength is improved. An exemplary component has a conductive substrate, a coil as the high-frequency circuit-element, a mounting board including a thin dielectric film on which the coil is mounted, and a support board that couples the mounting board to the substrate. The mounting board is coupled so that it floats relative to the substrate as a result of deliberate warping of the support board.

18 Claims, 14 Drawing Sheets

HIGH-FREQUENCY CIRCUIT COMPONENTS

CROSS-REFERENCE TO RELATED APPLICATION

This application is a continuation of, and claims priority to and the benefit of, PCT application no. PCT/JP2007/059860, filed on May 14, 2007, and incorporated herein by reference in its entirety. The PCT application claims priority to and the benefit of Japan Patent application no. 2006-155497, filed on Jun. 3, 2006.

TECHNICAL FIELD

This disclosure pertains to, inter alia, high-frequency circuit components used in circuits operating with high frequencies such as radio frequencies (RF). In this specification and appended claims, it will be understood that the high-frequency circuit component may be a portion of the constituent elements of a high-frequency circuit or may be an entire high-frequency circuit.

BACKGROUND ART

In wireless communication technology such as portable equipment, of which portable telephones are representative, data-communication rates are continually increasing. As the used frequencies increase from several hundred MHz to GHz (e.g., in overseas roaming services, etc.), multiple frequencies are switched among and used in a single unit of equipment.

Conventionally, a device having a coil (inductor) used in high-frequency circuits of such equipment comprises a substrate, such as a silicon substrate, a conductive loop, and two conductive supports (see FIG. 1 of Patent Document 1, below). Another conventional device comprises a substrate, such as a silicon substrate, a conductive spiral, two conductive supports, and two conductive hinged plates (see FIG. 5 of Patent Document 1, below). The conductive loop and the conductive spiral each comprise a coil (inductor).

In the device disclosed in FIG. 1 of Patent Document 1, one end of the conductive loop is mechanically connected to the substrate by one of the conductive supports, the other end of the conductive loop is mechanically connected to the substrate by the other conductive support. Thus, the conductive loop is supported so as to float relative to the substrate by means of the two conductive supports. Mechanical connections to the conductive loop are made by mechanically connecting the ends of the conductive loop to respective ends of the two conductive supports.

In the device disclosed in FIG. 5 of Patent Document 1, one of the conductive hinged plates that has been hinge-coupled to the substrate and one end of the conductive spiral are mechanically connected by one of the conductive supports. The other conductive hinged plate that has been hinge-coupled to the substrate and the other end of the conductive spiral are mechanically connected by the other conductive support. Thus, the conductive spiral is supported so as to float relative to the substrate by means of the two conductive supports and the two conductive hinged plates. Mechanical connections to the conductive spiral are made by both ends of the conductive spiral being respectively mechanically connected to the ends of the two conductive supports.

In such conventional devices, floating the coil (conductive loop or conductive spiral) relative to the substrate reduces parasitic capacitance between the coil and the substrate, even in cases in which the substrate is conductive, such as a silicon substrate.

In Patent Document 2, below, various structures are disclosed that support a mirror board, comprising a thin film, in a non-parallel fashion, such as vertically, with respect to a substrate.

Patent Document 1: Japan Unexamined Patent Application Publication No. 2000-150251.

Patent Document 2: International Publication No. 03/060592 pamphlet.

DISCLOSURE OF THE INVENTION

Problems to Be Solved

In the conventional devices disclosed in Patent Document 1, mechanical connections of the coil are made only by the ends of the conductive spiral being mechanically connected to respective ends of two conductive supports. This configuration reduces the mechanical strength of the coil. Therefore, for example, there is danger of the coil breaking due to airflow or the like encountered during, for example, inspection after manufacturing.

In addition, there are elements other than coils that comprise high-frequency circuits (high-frequency circuit elements). These other elements include, but are not limited to, capacitors, resistors, switches that perform switching, etc., of the signal paths, and mechanical filters for extracting only specific frequency components. Conventionally, the parasitic capacitances contributed by these other elements have been completely overlooked, and approaches such as supporting these other elements to float them relative to the substrate, as if they were floating coils, were unknown. Therefore, high-frequency circuit elements other than coils exhibited large parasitic capacitances between the elements and the substrate, resulting in electrical loss.

In addition, in the conventional device disclosed in Patent Document 1, mechanical connections to the coil are made only by both ends of the conductive spiral being mechanically connected to respective ends of two conductive supports. Consequently, in a case in which two or more coils are used in a high-frequency circuit, the coils are separately supported by two respective sets of conductive supports and thus independently floated from the substrate. In such a case, to connect two or more coils together electrically, a part of the connection path between the two coils must be a wiring pattern formed on the substrate. Unfortunately, this manner of connecting multiple coils produces a relatively large floating capacitance between the wiring pattern and the substrate.

The present invention takes such circumstances into account, and provides, inter alia, high-frequency circuit components that reduce parasitic capacitances between a high-frequency circuit elements and the substrate and that provide increased mechanical strength.

The present invention also provides high-frequency circuit components that include high-frequency circuit elements other than or in addition to coils, but that exhibit reduced parasitic capacitances with respect to the substrate and that provide increased mechanical strength.

The present invention also provides high-frequency circuit components that not only reduce parasitic capacitances between high-frequency circuit element(s) and the substrate but also reduce parasitic capacitances in the connection path between multiple high-frequency circuit elements and the substrate. The components also have increased mechanical strength.

Means to Solve Problems

To solve the problems summarized above, high-frequency circuit components according to one aspect comprise a substrate, one or more high-frequency circuit elements, a mounting board comprising a thin film of a dielectric substance on which the one or more high-frequency circuit elements have been mounted, and a support board that mechanically connects the mounting board to the substrate and that supports the mounting board in a floating manner relative to the substrate.

In certain embodiments, the high-frequency circuit component is mounted on a conductive substrate. The one or more high-frequency circuit elements and the support can comprise a thin film.

In certain embodiments of the high-frequency circuit component, a level difference is formed along the entire peripheral edge, or a portion thereof, of the mounting board.

The number of high-frequency circuit elements mounted to the substrate is one or more. Certain embodiments comprise two or more high-frequency circuit elements. In these embodiments at least two high-frequency circuit elements (among the one or more high-frequency circuit elements) are electrically connected on the mounting board.

In certain embodiments of the high-frequency circuit component, at least one of the high-frequency circuit elements, among the one or more thereof, are respective coils. In other embodiments at least one of the high-frequency circuit elements, among the one or more thereof, is a fixed or variable capacitor. Here, "fixed" means that the capacitance value of the capacitor is fixed (substantially constant); "variable" in this context means that the capacitance value of the capacitor is variable (can be changed). In yet other embodiments, at least one of the high-frequency circuit elements, among the one or more thereof, is a mechanical switch.

Examples of high-frequency circuit elements are described herein, but it will be understood that the invention is not limited to these examples. In alternative embodiments the high-frequency circuit elements can be, for example, resistor combinations and/or mechanical filters.

Effects of the Invention

Effects include: (a) provision of a high-frequency circuit component exhibiting reduced parasitic capacitance with respect to the substrate and that has increased mechanical strength; (b) provision of a high-frequency circuit component exhibiting reduced parasitic capacitance with respect to the substrate and that has increased mechanical strength for the constituent high-frequency circuit elements other than or in addition to coils; and (c) provision of a high-frequency circuit component exhibiting not only reduced parasitic capacitance between a high-frequency circuit element and the substrate but also reduced parasitic capacitance between the connection paths of multiple constituent high-frequency circuit elements and the substrate while also exhibiting increased mechanical strength.

DETAILED DESCRIPTION OF REPRESENTATIVE EMBODIMENTS

High-frequency circuit components and elements according to the invention are described below, with reference to the accompanying drawings. The embodiments are not intended to be limiting in any way.

First Embodiment

Figure 1:
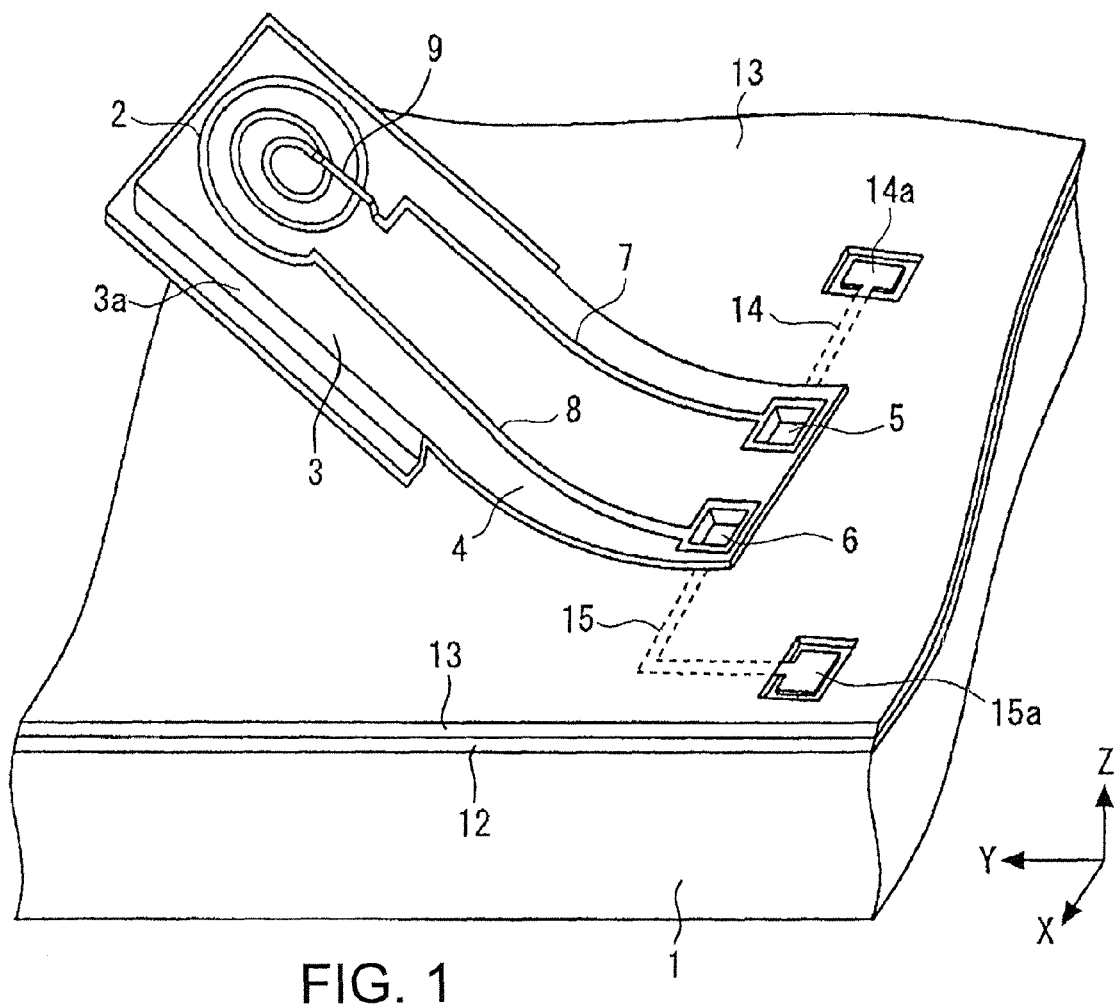
FIG. 1 is a schematic oblique view of a high-frequency circuit component according to the first embodiment.
Figure 2:
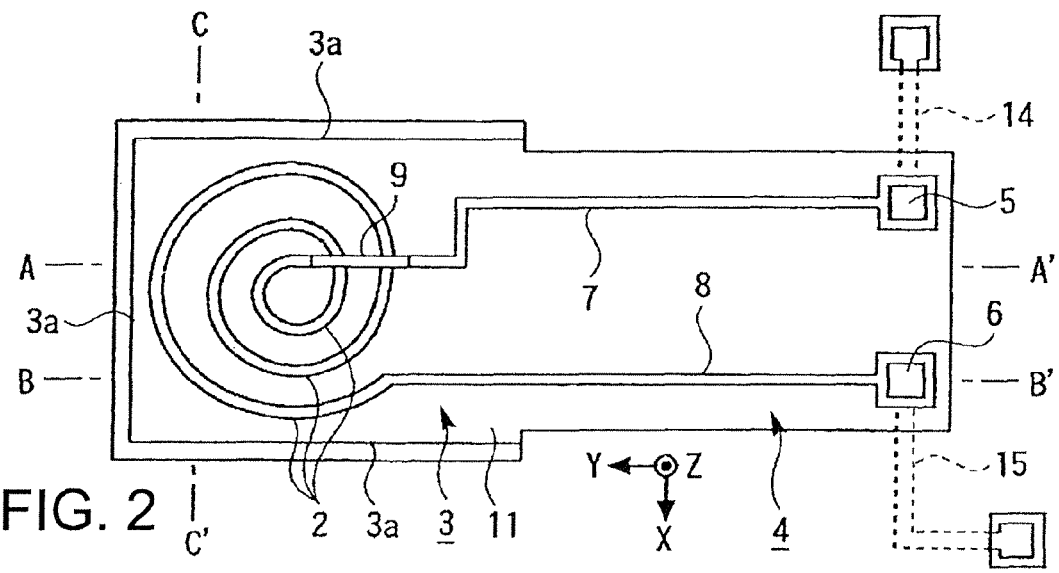
FIG. 2 is a schematic plan view showing a status prior to removing sacrificial layers of the high-frequency circuit component of the first embodiment.
Figure 3:
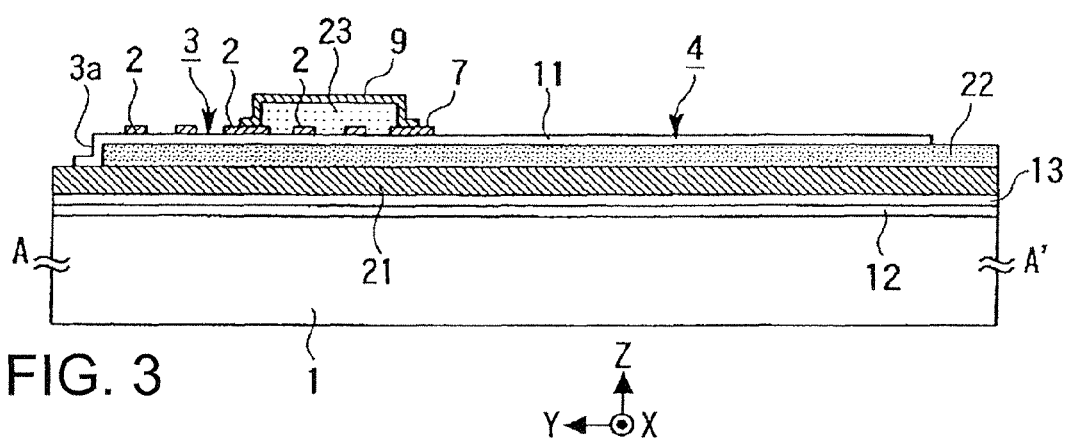
FIG. 3 is a schematic cross-sectional view along the line A-A' in FIG. 2.
Figure 4:
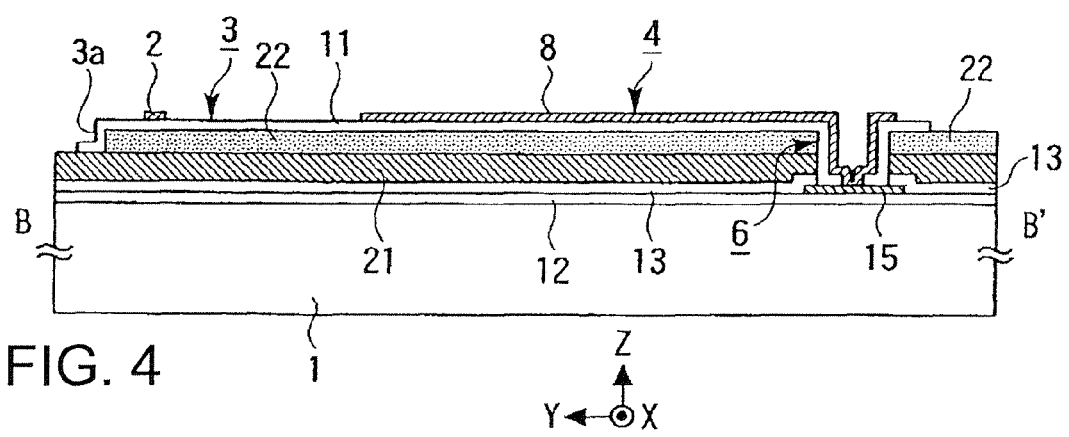
FIG. 4 is a schematic cross-sectional view along the line B-B' in FIG. 2.
Figure 5:
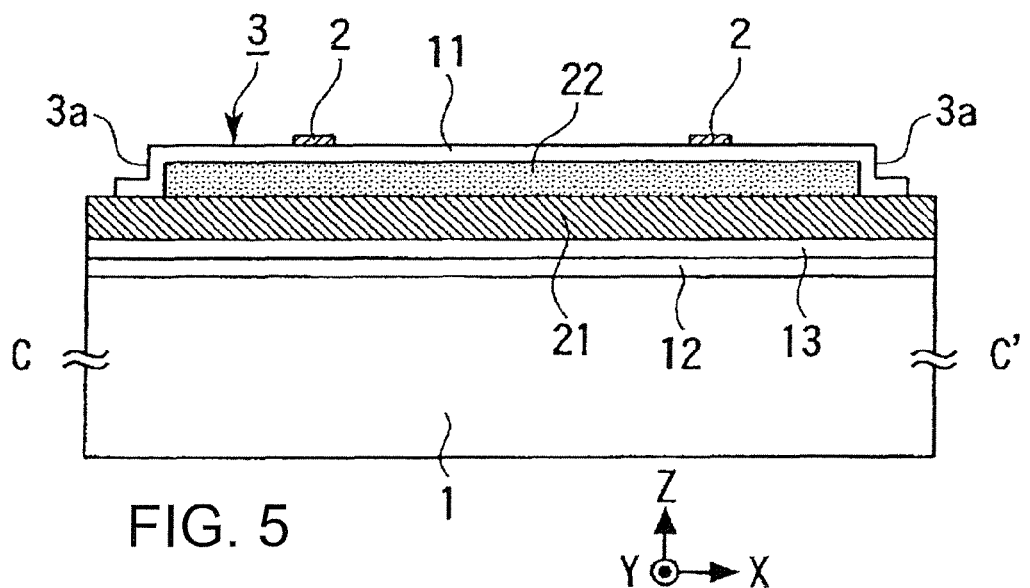
FIG. 5 is a schematic cross-sectional view along the line C-C' in FIG. 2.

FIG. 1 is a schematic oblique view of a high-frequency circuit component according to this embodiment. FIG. 2 is a schematic plan view of the component; FIG. 3 is a schematic cross-sectional view along the line A-A' in FIG. 2; FIG. 4 is a schematic cross-sectional view along the line B-B' in FIG. 2; and FIG. 5 is a schematic cross-sectional view along the line C-C' in FIG. 2. FIGS. 2-5 show a status prior to removing sacrificial layers 21-23 in the corresponding process for manufacturing high-frequency circuit components according to this embodiment. Note that, in FIG. 2 the sacrificial layers 21-23 are not shown.

For convenience of explanation, as shown in FIGS. 1-5, mutually orthogonal X axis, Y axis, and Z axis are defined as shown. (The same holds for other figures discussed later below.) The surface of the substrate 1 is parallel to the XY plane. The orientation of the arrow of the Z-axis direction is called the +Z direction or the +Z side, and the orientation of the opposite direction is called the −Z direction or the −Z side.

The same holds for the X-axis direction and the Y-axis direction. Note that there are cases in which the +Z side is called the "upper" side, and in which the −Z side is called the "lower" side. Note also that materials, etc., described below are exemplary only and are not intended to be limiting.

A high-frequency circuit component according to this embodiment comprises a substrate 1 made of silicon or GaAs, for example. The substrate 1 is electrically conductive. Extending from the substrate 1 is a coil (inductor) 2, which is a high-frequency circuit element, mounted to a mounting board 3 comprising a thin film of a dielectric substance. A support board 4 mechanically connects mounting board 3 to the substrate and supports the mounting board 3 in a floating manner from the substrate 1.

In this embodiment the mounting board 3 and support board 4 have respective rectangular shapes. The −Y end of the mounting board 3 and the +Y end of the support board 4 are mechanically connected together as a unit. Two legs 5, 6 are provided near the −Y end of the support board 4. The legs 5, 6 are both fixed to the substrate 1, with the support board 4 extending obliquely upward from the surface of the substrate 1 and with the mounting board 3 extending further upward, as shown in FIG. 1.

The mounting board 3 comprises a film 11 of silicon nitride serving as a thin film of a dielectric substance. A respective level difference 3a is formed along three sides (+X side, −X side, and +Y side) of the outer edge of the mounting board 3. This level difference 3a reinforces the main surfaces of the mounting board 3, prevents warping of the mounting board 3 due to internal stress of the silicon nitride film 11, and thus maintains the flatness of the main surfaces of the mounting board 3.

The coil 2 comprises a thin aluminum film formed on the upper surface of the mounting board 3 and patterned in a coil shape. The number of turns of the coil is not limited. The coil 2 alternatively may have, for example, multiple turns or one turn only and need not necessarily be formed in a coil shape.

The support board 4 comprises the film 11 of silicon nitride extending from the mounting board 3. Level differences are not formed on the edges of the support board 4. Hence, during processing (discussed below), after removing sacrificial layers 21-23 to complete fabrication of the high-frequency circuit component of this embodiment, the support board 4 warps upward as shown in FIG. 1 due to the internal stress of the silicon nitride film 11. Thus, as shown in FIG. 1, the support board 4 is supported in a non-parallel manner relative to the substrate by the legs 5, 6 being fixed to the substrate 1. I.e., the mounting board 3 is lifted up from and "floated" relative to the substrate 1 by the support board 4.

Although not detailed, the silicon nitride film 11 is a two-layer film comprising an upper layer and a lower layer each comprising silicon nitride. Using such a two-layer film stress can be imparted to the film (e.g., by varying respective film-formation conditions for the upper and lower layers) that causes upward warping of the support board 4. Alternatively or in addition, the respective materials of the upper and lower layers can be varied. If the film 11 is alternatively made of a single layer, it is still possible to impart stress that causes upward warping.

Respective wires 7, 8, are connected at the two ends of the coil 2. The wires 7, 8 are formed on the mounting board 3 and the support board 4. The wire 7 comprises an aluminum film and is connected to one end of the coil 2 via an arc-shaped three-dimensional wire bridge 9 also made of aluminum film. The wire 8 is simply an extension of the aluminum film comprising the coil 2.

The legs 5, 6 are respective extensions of the silicon nitride film 11 and the aluminum films of the wires 7, 8 from the support board 4 toward the surface of the substrate 1. The aluminum film of the wires 7, 8, is respectively connected to wires 14, 15, also comprising aluminum film, at the respective legs 5, 6. On the substrate 1, insulating films 12, 13, such as films of silicon oxide or silicon nitride, are laminated in sequence from the substrate 1 side, and the wires 14, 15 are connected between the insulating films 12, 13 to the wires 7, 8, respectively. The distal ends of the wires 14, 15 include a signal contact 14a and a ground contact 15a, respectively. The contacts 14a, 15a are exposed to the exterior from respective openings formed in the insulating films 12, 13. Thus, the contacts 14a, 15a are respectively connected electrically to both ends of the coil 2. Utilizing the contacts 14a, 15a, the coil 2 becomes a respective part of a high-frequency circuit. Note that it is also possible to provide two ground contacts 15a and employ a ground-signal-ground connection such as that disclosed in Patent Document 1.

An example method for manufacturing the high-frequency circuit component of this embodiment is now briefly described. First, an insulating film 12, such as a film of silicon nitride or other suitable dielectric, is formed on the substrate 1 (e.g., silicon substrate). Next, an aluminum film is formed, and the aluminum film is patterned to the shapes of the wires 14, 15 and the contacts 14a, 15a by a photolithoetching technique. The insulating film 13 is formed, and openings are formed in the insulating film 13 at locations corresponding to respective locations of the legs 5, 6. The openings in the insulating film 13 are also formed using a photolithoetching technique. At this time, openings that expose the contacts 14a, 15a are also formed in the insulating film 13. Next, sacrificial layers 21, 22 (e.g., respective layers of photoresist) are sequentially formed. Openings are formed in the sacrificial layers 21, 22 at locations where the respective legs 5, 6 are to be formed. The sacrificial layer 22 is formed with an "island" configuration corresponding to the shape of the mounting board 3 and support board 4.

Next, the lower and upper layers of the silicon nitride film 11 are sequentially formed. The respective film-formation conditions are established so that the support board 4 warps upward after the sacrificial layers 21-23 have been removed. Then, the silicon nitride film 11 is patterned into the shape of the mounting board 3 and of the support board 4 using a photolithoetching technique. At this time, contact holes are formed on the silicon nitride film 11 at the locations of the legs 5, 6.

An aluminum film is formed and patterned to the shapes of the coil 2 and the wires 7, 8, using a photolithoetching technique. Then, a sacrificial layer 23 (e.g., of photoresist) is formed in an island shape and at a region corresponding to the three-dimensional wire bridge 9. Afterward, an aluminum film is formed and patterned to the shape of the wire bridge 9, using a photolithoetching technique. The resulting configuration is shown in FIGS. 2-5. Lastly, the sacrificial layers 21-23 are removed by ashing, etc. As shown in FIG. 1, upon removing the sacrificial layers the support board 4 warps upward, the mounting board 3 is lifted, and manufacture of the high-frequency circuit component is completed.

In this embodiment, as shown in FIG. 1, the coil 2 is supported so as to float relative to the substrate 1. A benefit of this configuration is that the parasitic capacitance between the coil 2 and the substrate 1 is reduced. Reduction in parasitic capacitance reduces electrical loss from the high-frequency component and from a circuit comprising the high-frequency component.

In contrast to the device disclosed in Patent Document 1, this embodiment provides an independent mechanical connection with respect to the coil 2 at both ends of the coil 2. Also, a mounting board 3 is used, and the coil 2 is mounted on the mounting board 3 and is held by the mounting board 3, which further increases the mechanical strength of the coil 2. Therefore, this embodiment reduces concern that the coil 2 will break from exposure to air flow, such as during inspection after manufacture.

Figure 6:
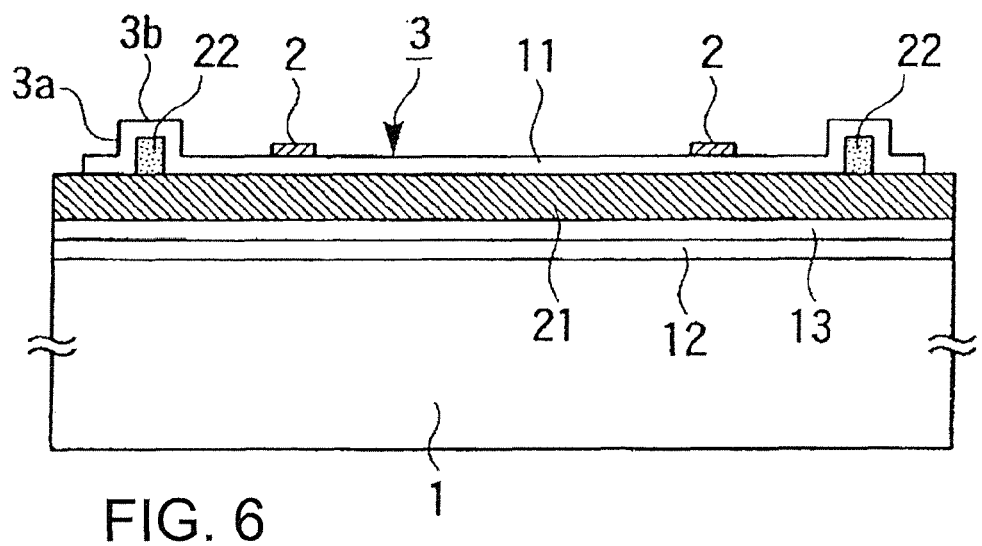
FIG. 6 is a schematic cross-sectional view of an alternative example of the first embodiment.
Figure 7:
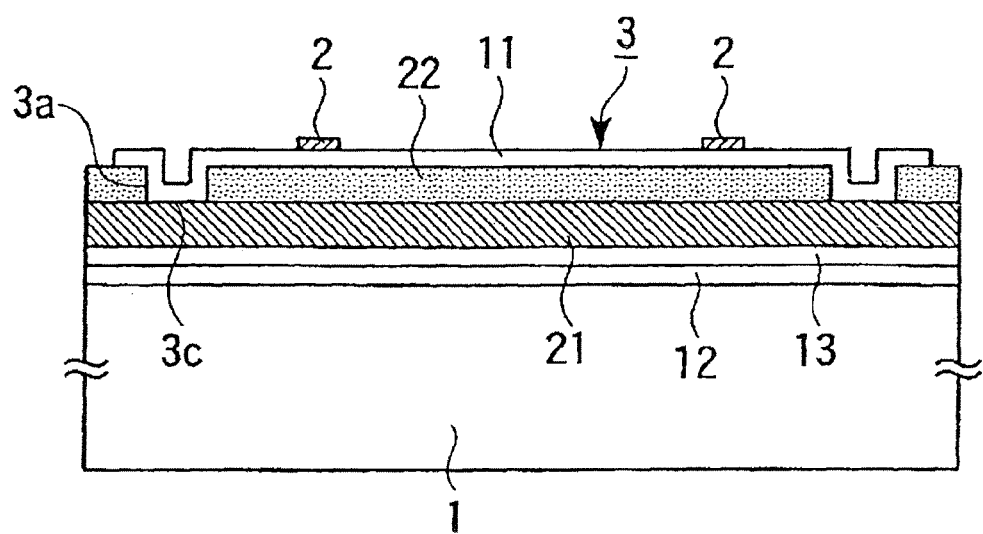
FIG. 7 is a schematic cross-sectional view of another alternative example of the first embodiment.

Alternative configurations of the first embodiment are now described with reference to FIGS. 6 and 7. (The first embodiment can be modified to either of these alternative configurations.) FIGS. 6 and 7 are schematic cross-sectional views of the respective alternative configurations of a high-frequency circuit component. FIGS. 6 and 7 correspond to FIG. 5 and show a status prior to removing the sacrificial layers 21-23. In FIGS. 6 and 7, identical symbols are used to denote respective items that are identical to or correspond to respective elements in FIG. 5, and duplicate descriptions of such items are omitted in the following discussion.

In these modification examples, the reinforcement structure of the mounting board 3 is changed relative to the embodiment of FIGS. 1-5. In the example of FIG. 6, the level difference 3a is formed by forming a protruding part 3b along the outer edge part of the mounting board 3. In the example of FIG. 7, the level difference 3a is formed by forming a recess 3c along the outer edge of the mounting board 3.

Note that these variations can be similarly applied to the respective embodiments discussed below.

Second Embodiment

Figure 8:
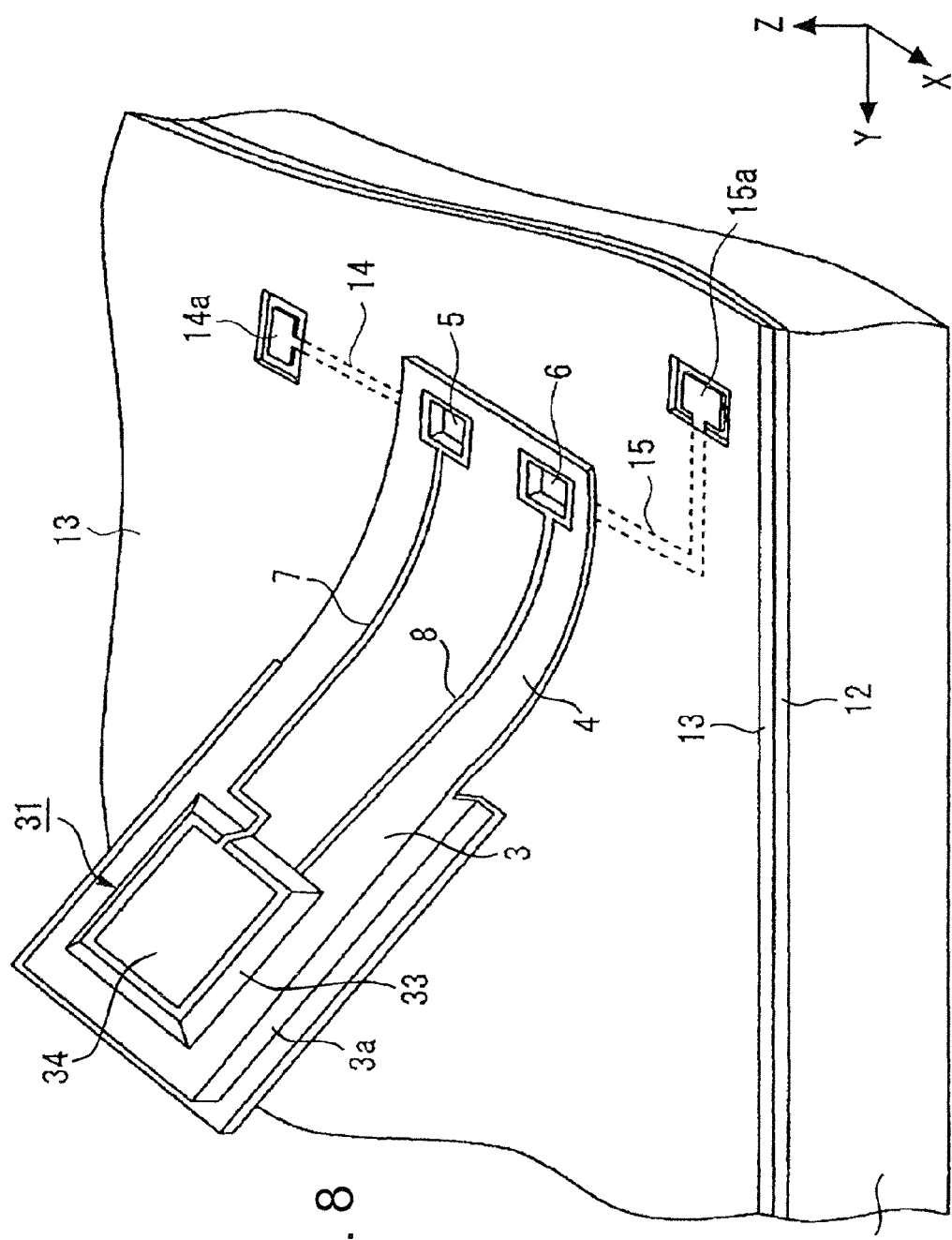
FIG. 8 is a schematic oblique view of a high-frequency circuit component according to the second embodiment.
Figure 9:
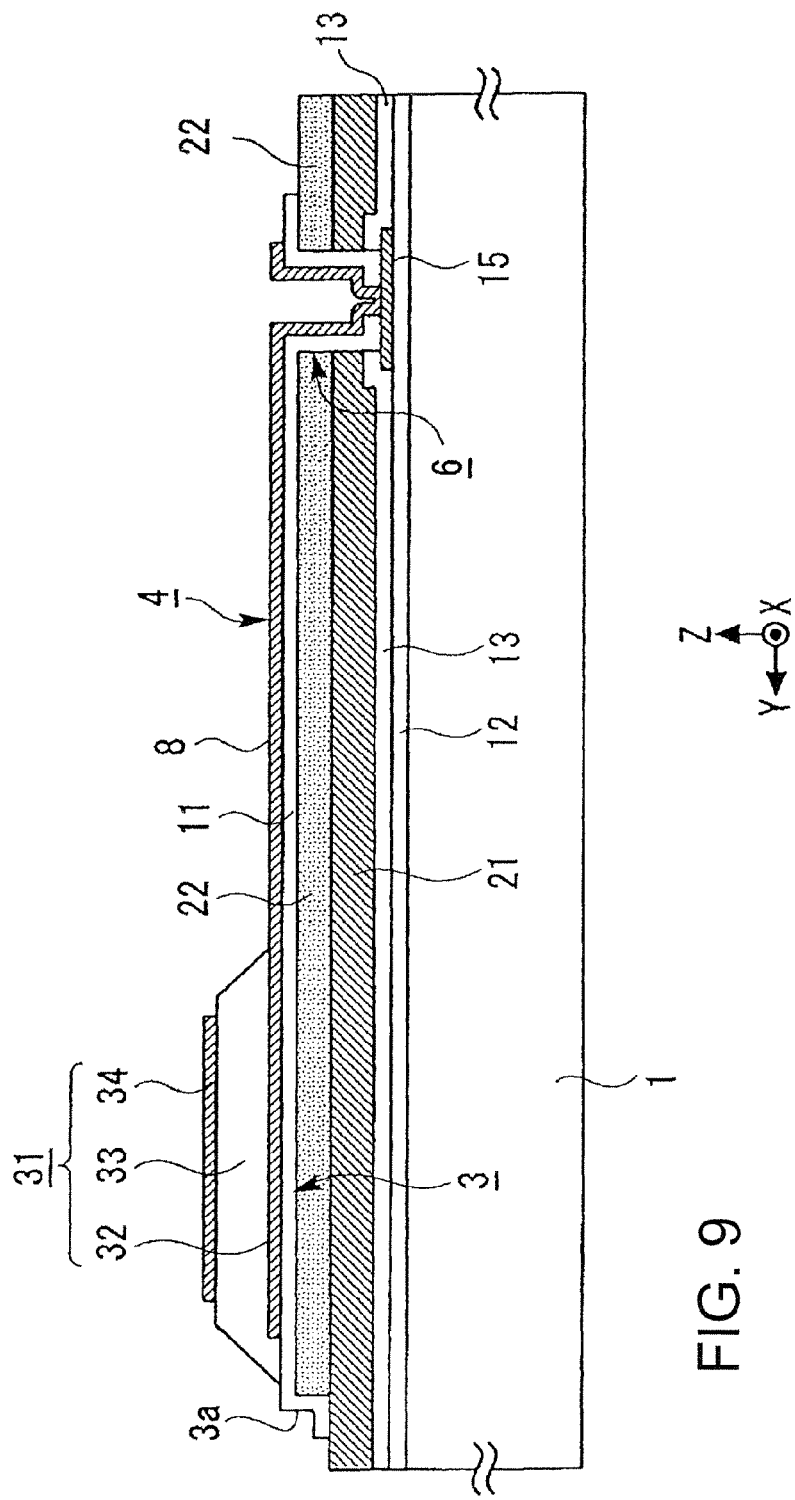
FIG. 9 is a schematic cross-sectional view of a high-frequency circuit component of the second embodiment.

FIG. 8 is a schematic oblique view of a high-frequency circuit component according to this embodiment. FIG. 8 corresponds to FIG. 1. FIG. 9 is a schematic cross-sectional view of a high-frequency circuit component of this embodiment. FIG. 9, corresponding to FIG. 4, shows a status prior to removing the sacrificial layers 21, 22 in the process of manufacturing a high-frequency circuit component according to this embodiment.

In FIGS. 8 and 9, identical symbols are assigned to respective items that are identical to or correspond to respective elements in FIGS. 1-5, and duplicate descriptions of these items are omitted below.

The aspect in which the second embodiment differs from the first embodiment is that a fixed capacitor 31 is mounted on the mounting board 3 as the high-frequency circuit element instead of a coil 2. The capacitor 31 comprises a first electrode 32 formed on the mounting board 3, a dielectric layer 33 (e.g., a silicon nitride film or a silicon oxide film) formed on the first electrode 32, and a second electrode 34 formed on the dielectric layer 33 in opposition to the first electrode 32 across the dielectric layer. The first electrode 32 comprises an aluminum (Al) film from which an Al wire 8 extends. The second electrode 34 comprises an Al film from which an Al wire 7 extends.

The high-frequency circuit component of this embodiment can be manufactured by a method similar to the method used for manufacturing the high-frequency circuit component of the first embodiment.

In the second embodiment, as shown in FIG. 8, the capacitor 31 is supported so that it floats above the surface of the substrate 1. Such a configuration reduces parasitic capacitance between the capacitor 31 and the substrate 1, which reduces electrical loss. In the capacitor 31, the area between the first and second electrodes 32, 34 is comparatively large, which provides a large reduction of parasitic capacitance. It is noted that configuring the capacitor 31 to float from the substrate 1 has conventionally been completely overlooked in the prior art.

Also, since a mounting board 3 is used, with the capacitor 31 being mounted on the mounting board 3, the mechanical strength of the high-frequency circuit component is increased.

Third Embodiment

Figure 10:
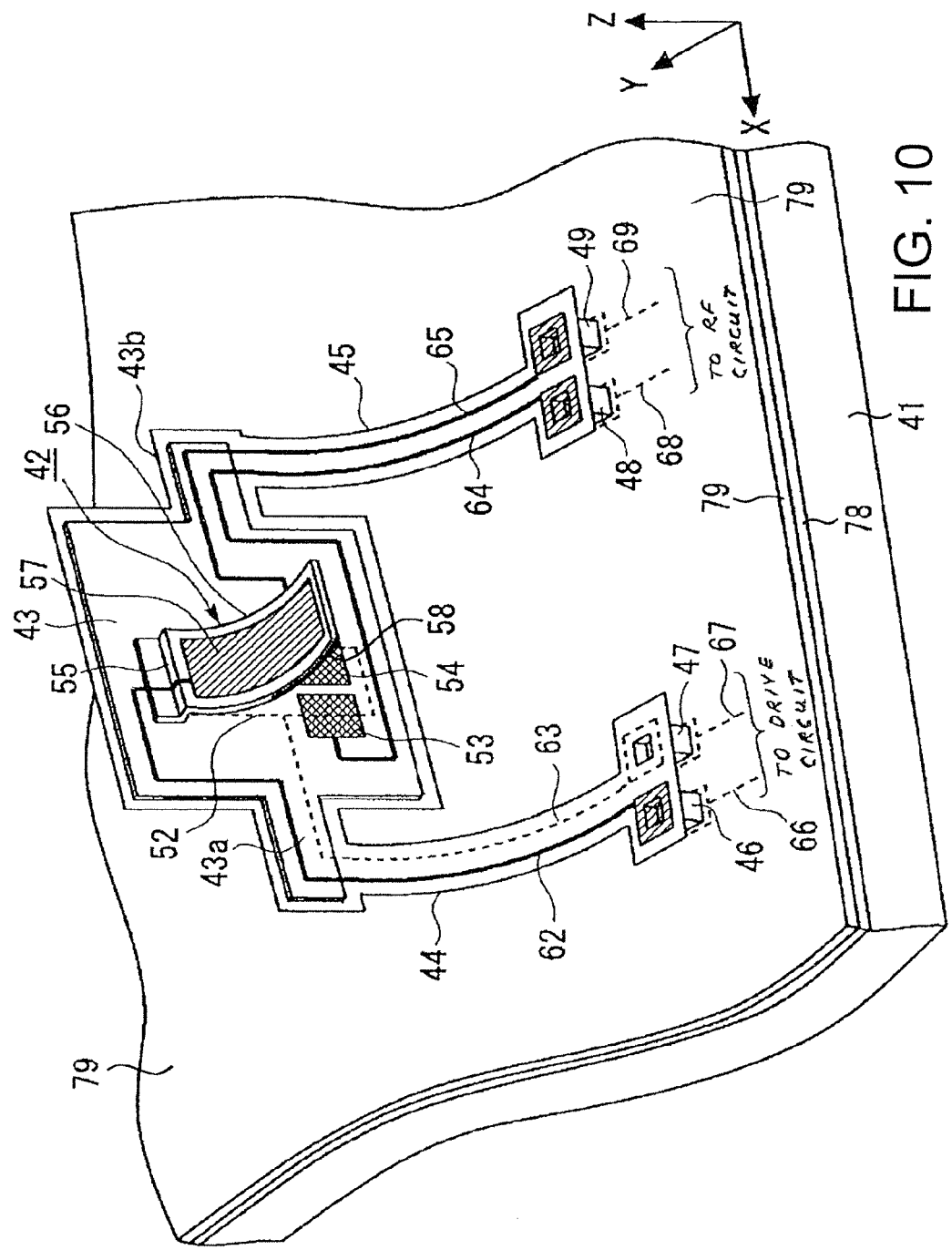
FIG. 10 is a schematic oblique view of a high-frequency circuit component according to the third embodiment.
Figure 11:
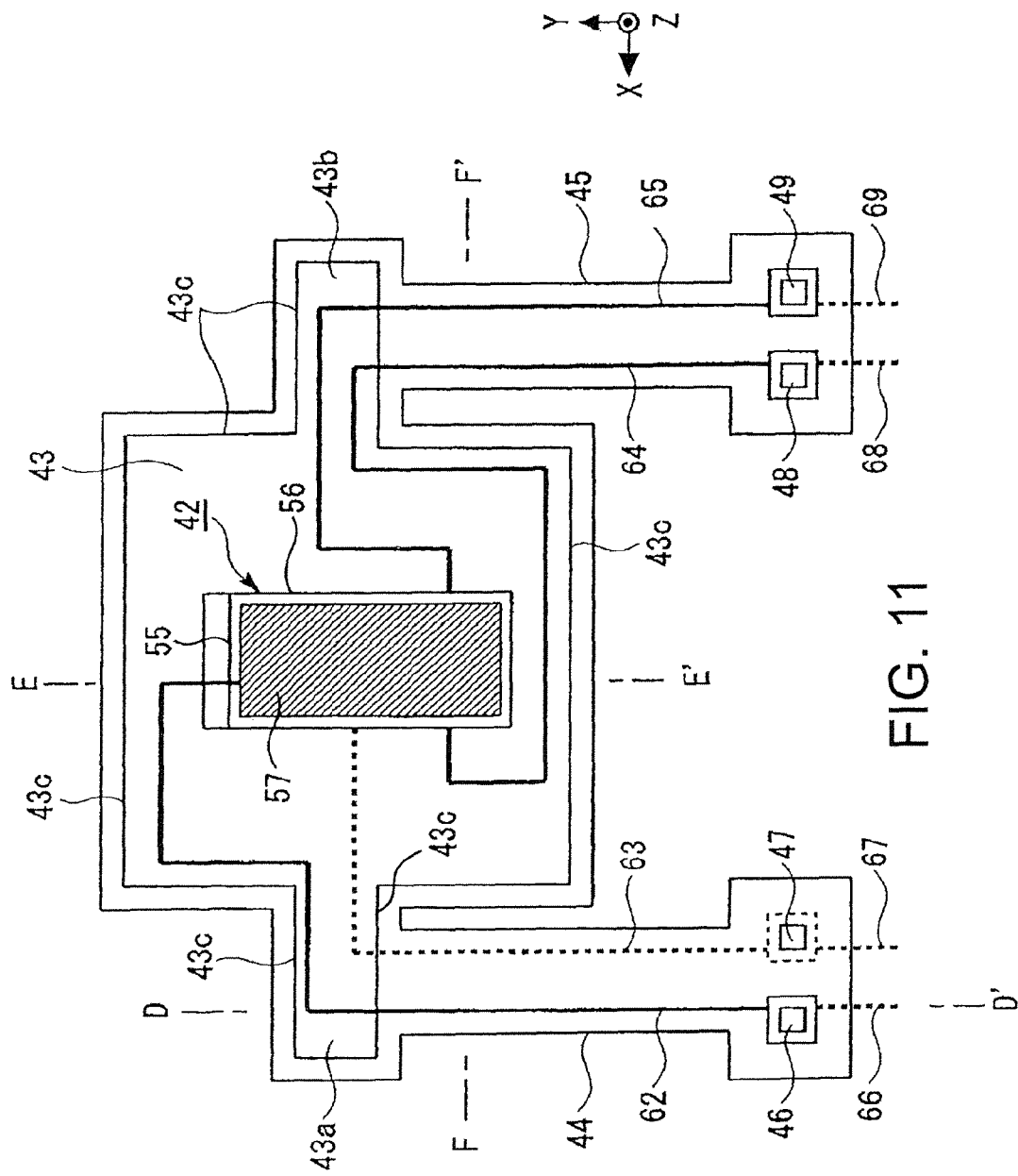
FIG. 11 is a schematic plan view of a high-frequency circuit component according to the third embodiment.
Figure 12:
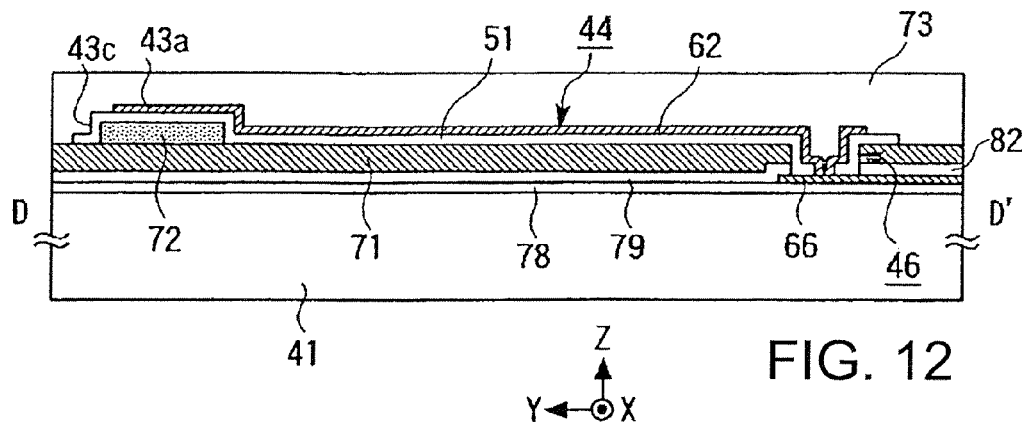
FIG. 12 is a schematic cross-sectional view along the line D-D' in FIG. 11.
Figure 13:
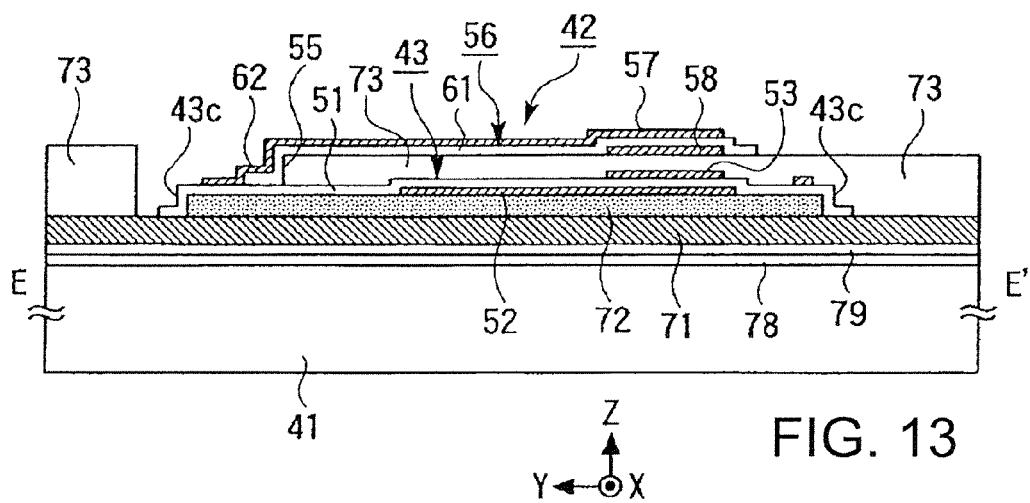
FIG. 13 is a schematic cross-sectional view along the line E-E' in FIG. 11.
Figure 14:
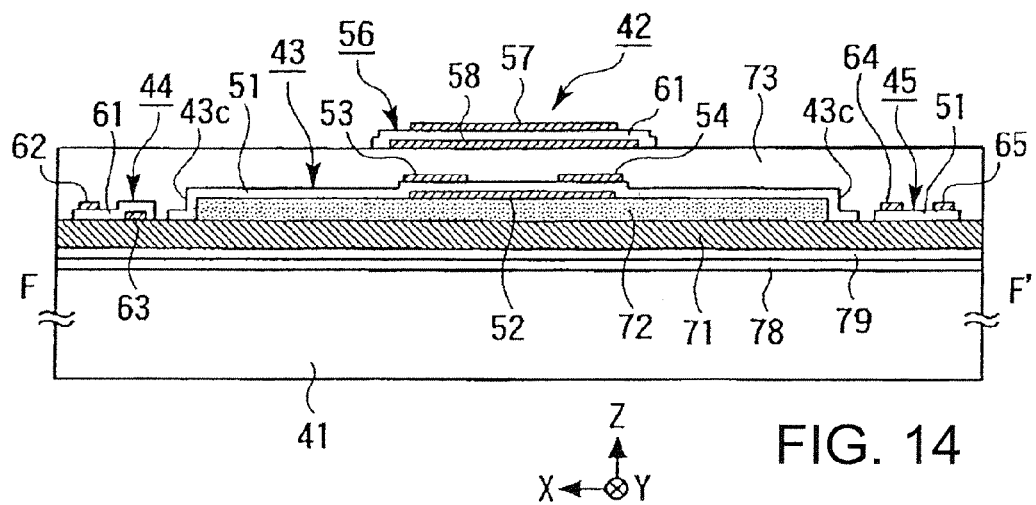
FIG. 14 is a schematic cross-sectional view along the line F-F' in FIG. 11.

FIG. 10 is a schematic oblique view of a high-frequency circuit component according to the third embodiment. FIG. 11 is a schematic plan view of the component, FIG. 12 is a schematic cross-sectional view along the line D-D' in FIG. 11, FIG. 13 is a schematic cross-sectional view along the line E-E' in FIG. 11, and FIG. 14 is a schematic cross-sectional view along the line F-F' in FIG. 11. FIGS. 11-14 show a status prior to removing sacrificial layers 71-73 in a process for manufacturing the high-frequency circuit component of this embodiment. Note that, to facilitate understanding, hatching is applied to certain elements shown in FIGS. 10 and 11. In addition, in FIG. 11, the sacrificial layers 71-73 are not shown.

The high-frequency circuit component of this embodiment comprises a silicon, GaAs, or other suitable substrate 41 that is electrically conductive. A mechanical switch 42 is the high-frequency circuit element of this embodiment. The switch 42 is mounted on a mounting board 43 that comprises a thin film of a dielectric substance on which the mechanical switch 42 is situated. Two strip-shaped support boards 44, 45 mechanically connect the substrate 41 to the mounting board 43 and support the mounting board 43 such that the mounting board 43 and switch 42 float relative to the surface of the substrate 41.

In the present embodiment, the mounting board 43 is essentially rectangular but includes protruding portions 43a, 43b extending from both sides (+X side and -X side) of the mounting board. The protruding portion 43a from the +X side of the mounting board 43 and the +Y end of the support board 44 are mechanically connected together as a unit. Similarly, the protruding portion 43b of the -X side of the mounting board 43 and the end +Y end of the support board 45 are mechanically connected together as a unit. Two legs 46, 47 are provided near the -Y end of the support board 44, and two legs 48, 49 are provided near the -Y end of the support board 45. The legs 46-49 are all fixed to the substrate 41, and the mounting board 43 and support boards 44 and 45 are such that the mounting board 43 is lifted up (FIG. 10) relative to the substrate surface, with the legs 46-49 being fixed ends.

The mounting board 43 comprises a dielectric film 51 (e.g., silicon nitride film). A level difference 43c is formed along the entire peripheral edge of the mounting board 43. This level difference 43c reinforces the main surfaces of the mounting board 43. Thus, warping of the mounting board 43 from internal stresses in the silicon nitride film 51 is limited, maintaining the flatness of the main surfaces of the mounting board 43.

The mechanical switch 42 in this embodiment comprises a first drive electrode 52 formed on the lower surface of the mounting board 43 (i.e., the -Z surface prior to removing the sacrificial layers 71-73). The switch 42 also includes first and second signal contacts 53, 54 formed on the upper surface (+Z surface) of the mounting board 43. The switch also includes a movable board 56 (forming a cantilever beam, one end of which being fixed to the upper surface of the mounting board 43 via a leg 55), a second drive electrode 57 formed on the upper surface of the movable board 56, and a movable contact 58 formed on the lower surface of the movable board 56.

The first and second drive electrodes 52, 57, first and second signal contacts 53, 54, and the movable contact 58 each comprise an aluminum film. The first drive electrode 52 and second drive electrode 57 oppose each other. The first and second signal contacts 53 and 54 are mutually separated, but both oppose the movable contact 58.

The leg 55 and the movable board 56 are connected by a silicon oxide film 61. Whenever electrostatic force is not acting between the first and second drive electrodes 52, 57, respectively, the movable board 56 is warped in a direction away from the mounting board 43 (FIG. 1) as a result of the internal stress of the silicon nitride film 61. In this status, the movable contact 58 is displaced from the first and second signal contacts 53, 54, and the space between the first and second signal contacts 53, 54 is electrically open. Whenever a voltage at or above a prescribed value is applied between the first and second drive electrodes 52, 57 to cause electrostatic force to act between the two, the movable board 56 moves toward the mounting board 43, and the movable contact 58 contacts the first and second signal contacts 53, 54. As a result, the space between the first and second signal contacts 53, 54 is short-circuited by the movable contact 58, and is electrically closed.

Although not shown, the silicon oxide film 61 is actually a two-layer film with an upper layer and a lower layer respectively comprising silicon oxides. By appropriately varying the film-formation conditions under which the upper layer and lower layer are formed, the desired amount of upward warping stress can be imparted. For example, the respective materials of the upper layer and the lower layer can be varied. Alternatively, if the film 61 is formed of a single layer, it is possible to impart stress sufficient to produce warping away from the mounting board 43. In addition, in this embodiment, the movable board 56 is a cantilever beam as discussed above. Alternatively, for example, it is configured as a double-supported beam.

The support boards 44, 45 comprise a silicon nitride film 51 extending from the mounting board 43. Level differences are not formed on the support boards 44, 45. Hence, when the sacrificial layers 71-73 are removed, the support boards 44, 45 can warp upward as shown in FIG. 10 due to the internal stress of the silicon nitride film 51. Thus, as shown in FIG. 10, the support boards 44, 45 are supported in a manner that is not parallel to the surface of the substrate, which elevates the mounting board 43 relative to the fixed legs 46-49 and floats the mounting board 43 relative to the substrate 41 by means of the support boards 44, 45. In the present embodiment, the mounting board 43 is supported nearly vertically with respect to the substrate 41.

To stabilize the mounting board 43 further as it is supported nearly vertically, the support boards 44, 45 are preferably configured to have sufficient internal stress to warp at an angle greater than 90 degrees. Whenever the mounting board 43 has become vertical, it is desirable that a stopper be provided on the substrate 41 to contact and hold the mounting board 43. An example of such a stopper is shown in FIG. 10 of Patent Document 2.

Although not shown, the silicon nitride film 51 is actually a two-layer film with an upper layer and a lower layer respectively formed of silicon nitride. By appropriately varying the respective film-formation conditions in which the upper layer and lower layer are formed, it is possible to impart a desired degree of upward warping.

A wire 62 connected to the second drive electrode 57 is formed on the mounting board 43 and the support board 44. The wire 62 comprises the aluminum film extending from the second drive electrode 57. A wire 63, formed below the mounting board 43 and support board 44, is connected to the first drive electrode 52. The wire 63 comprises the aluminum film extending from the first drive electrode 52. Wires 64, 65, respectively connected to the first and second signal contacts 53, 54, are formed on the mounting board 43 and support board 45. The wires 64, 65 are respectively formed of the aluminum film forming the first signal contact 53 and the second signal contact 54.

The legs 46-49 comprise the silicon nitride film 51 of the support boards 44, 45 and the aluminum film of the wires 62, 63, 64, 65. The aluminum film of the wires 62-65 are respectively connected to wires 66-69 comprising the aluminum film in the respective legs 62-65. On the substrate 41, insulating films 78, 79 (e.g., silicon oxide film or and silicon nitride film) are laminated in sequence from the substrate 41 side, and wires 62-65 are formed between insulating films 78 and 79.

As is clear from the above description, the wires 67 and 66 are respectively connected to first and second drive electrodes 52, 57, and the wires 68, 69 are connected to first and second signal contacts 53, 54, respectively. The wires 67, 66 are connected to a drive circuit (not shown) that controls the voltage applied between the first and second drive electrodes 52, 57. The wires 68, 69 are connected to another desired location of a high-frequency circuit.

The high-frequency circuit component of the third embodiment is manufactured using various semiconductor-manufacturing techniques as required, such as film formation, patterning, etching, and sacrificial layer formation and removal in the same way as the high-frequency circuit component of the first embodiment to bring about a status shown in FIGS. 11-14. The sacrificial layers 71-73 are removed by ashing or the like. Thus, the support boards 44, 45 warp upward as shown in FIG. 10, which lifts the mounting board 43 upward, thereby completing fabrication of the high-frequency circuit component.

In this embodiment, as shown in FIG. 11, the mechanical switch 42 is supported such that it floats relative to the substrate 41. This configuration has several benefits such reduced parasitic capacitance between the mechanical switch 42 and the substrate 41. Reducing the parasitic capacitance reduces electrical loss. It is noted that configuring the mechanical switch 42 to float relative to the substrate 41 has been completely overlooked in the prior art.

In addition, in this embodiment, the mounting board 43 is configured, and the mechanical switch 42 is mounted on the mounting board 43, to increase the mechanical strength thereof.

Fourth Embodiment

Figure 15:
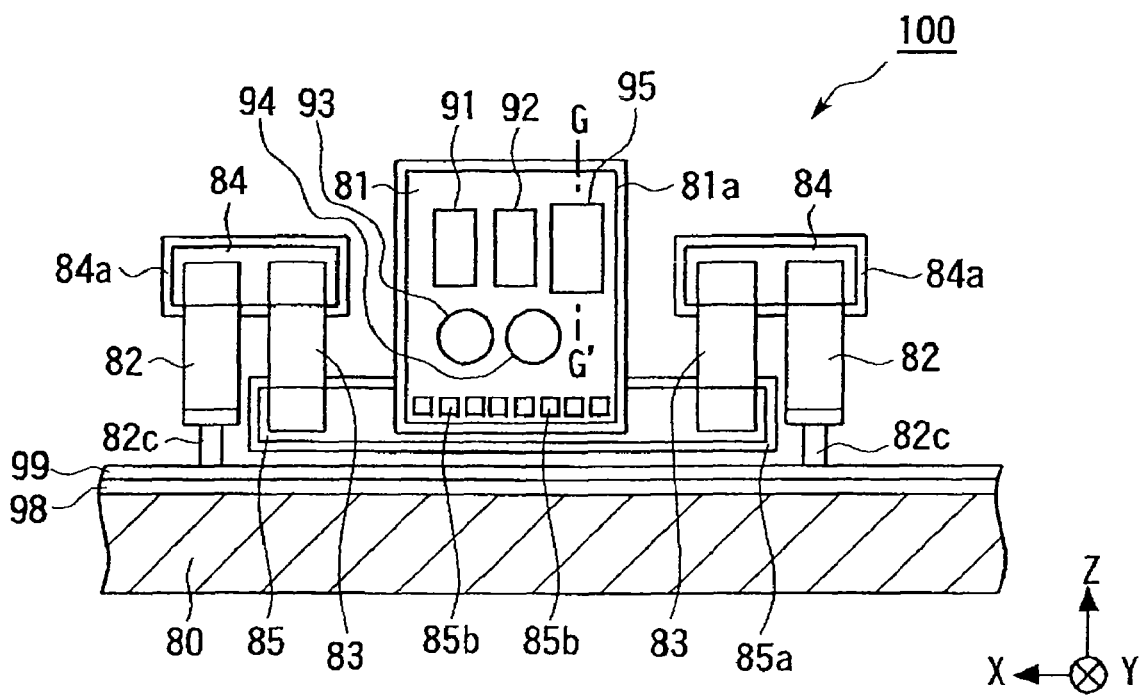
FIG. 15 is a schematic oblique view of a high-frequency circuit component according to the fourth embodiment.
Figure 16:
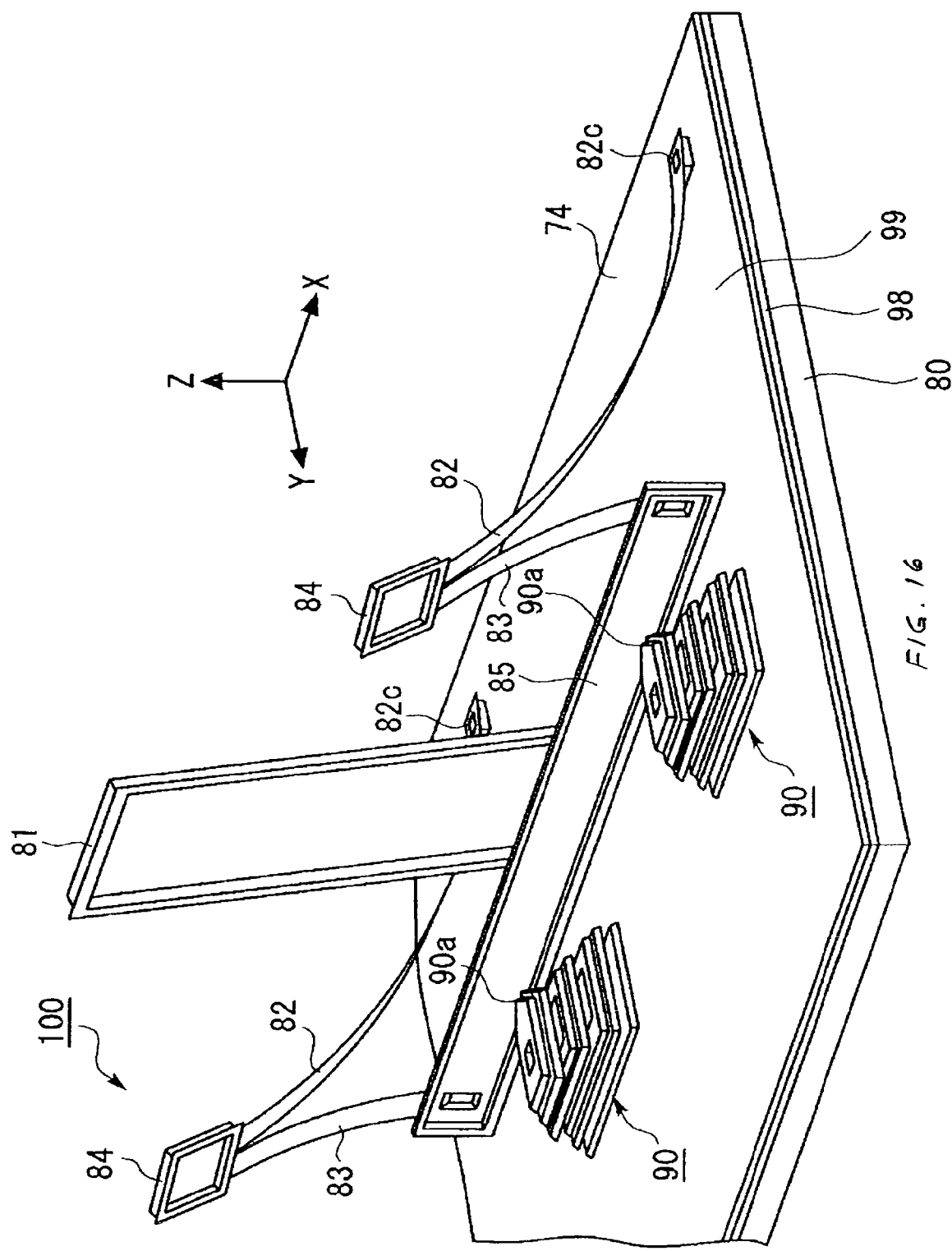
FIG. 16 is a schematic oblique view of the high-frequency circuit component according to the fourth embodiment.
Figure 18:
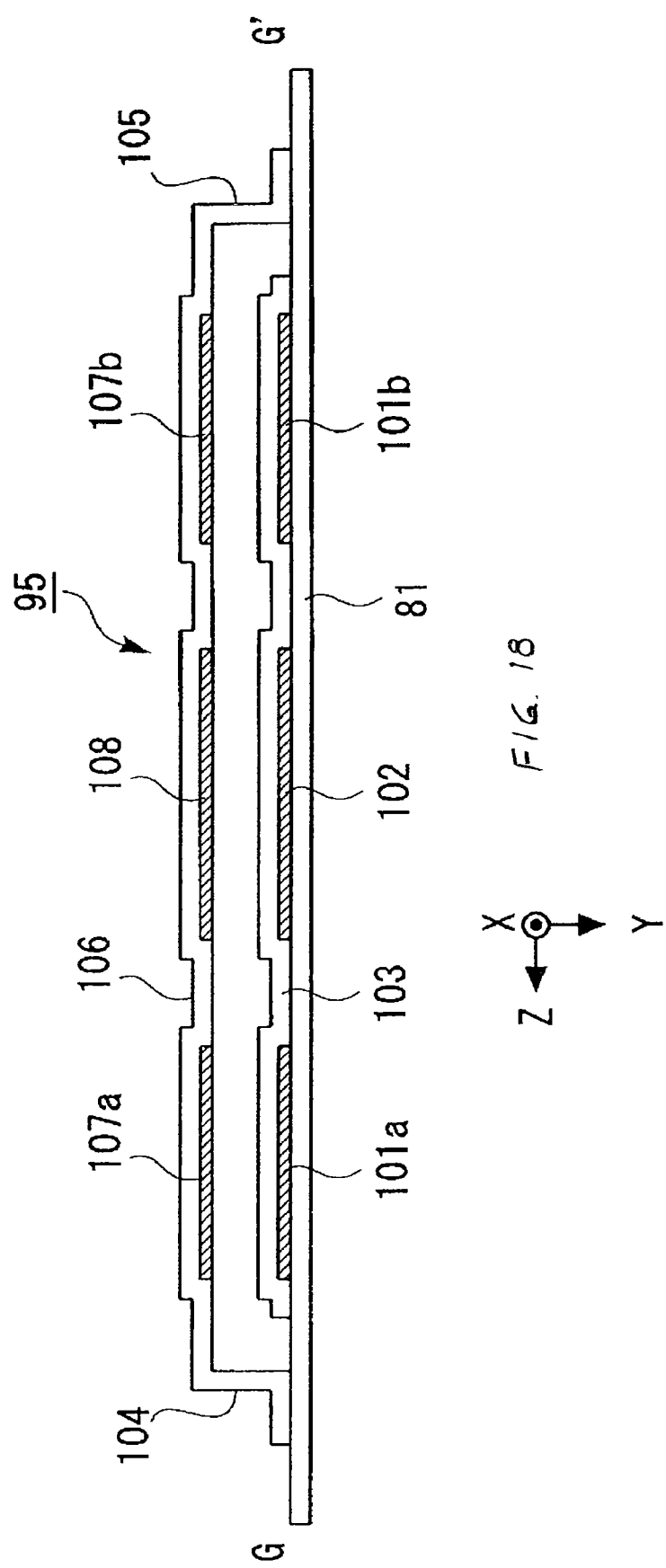
FIG. 18 is a schematic cross-sectional view along the line G-G' in FIG. 15.
Figure 19:
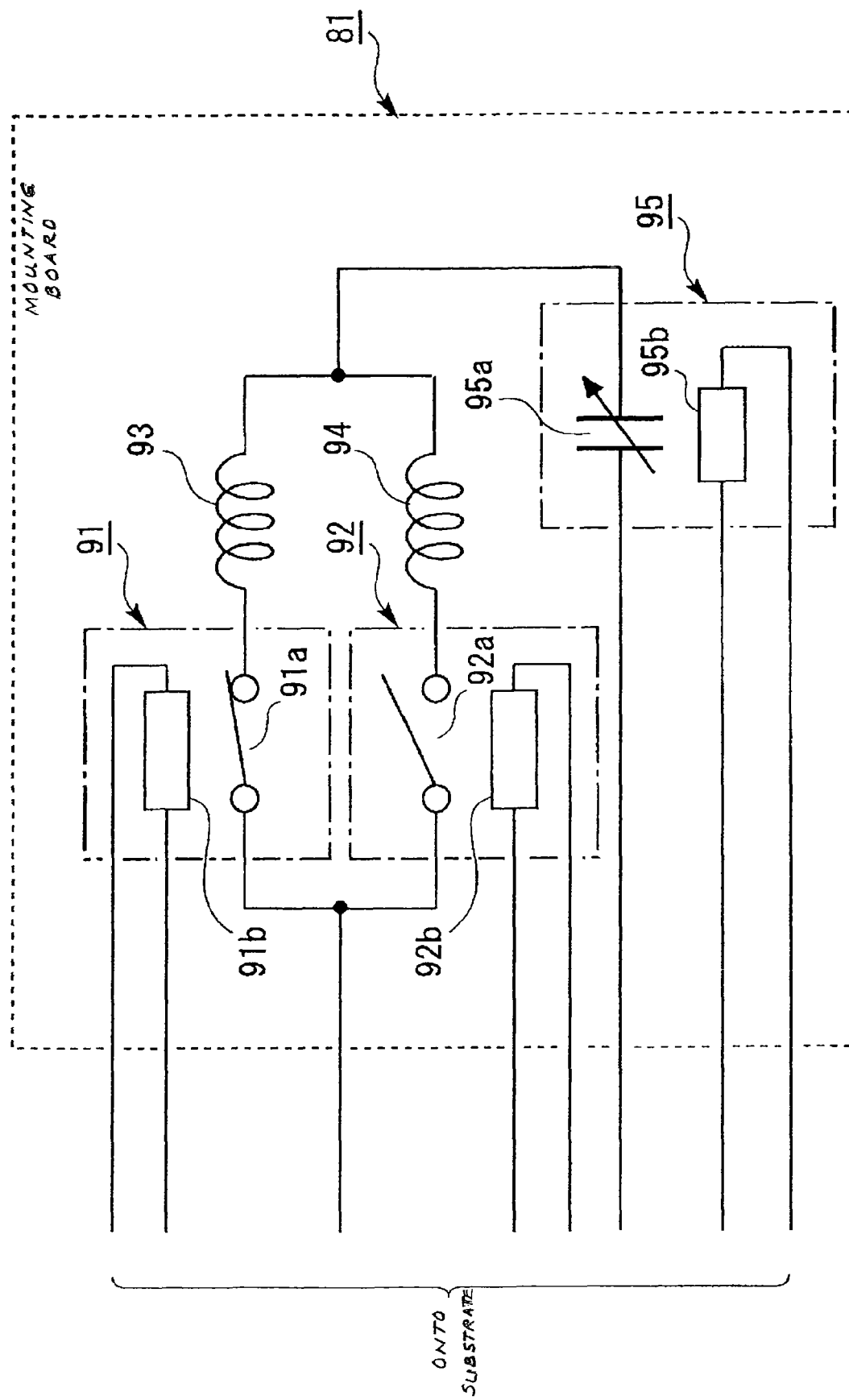
FIG. 19 is a schematic diagram of a circuit mounted on the mounting board in FIG. 15.

FIG. 15 is a schematic front view of a high-frequency circuit component according to the fourth embodiment. FIG. 16 is a schematic oblique view of the high-frequency circuit component, FIG. 17 is a schematic elevational section of the component, FIG. 18 is a schematic cross-sectional view along the line G-G' in FIG. 15, and FIG. 19 schematically depicts the circuit mounted on the mounting board 81.

Figure 17:
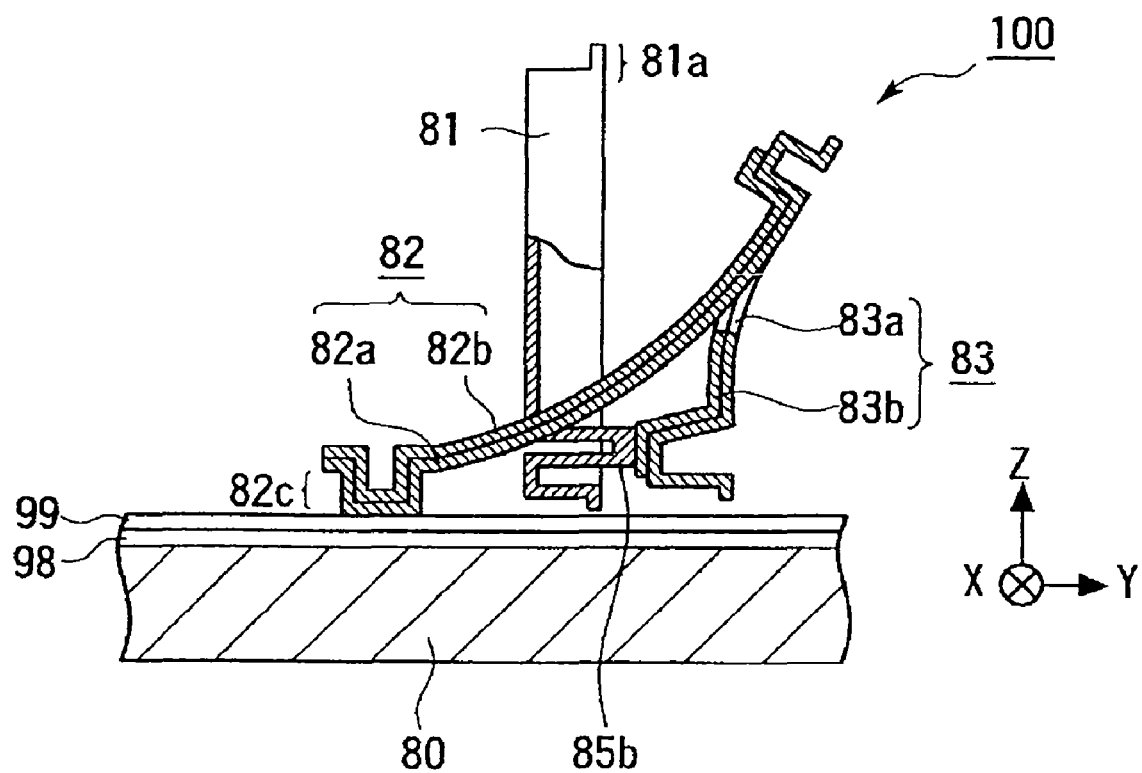
FIG. 17 is a schematic cross-sectional view of the high-frequency circuit component according to the fourth embodiment.

Note that the high-frequency circuit elements 91-95 mounted on the mounting board 81 are not shown in FIGS. 16 and 17. In addition, in FIGS. 15-17, drawings of wires and the like have also been omitted. FIGS. 15-18 are simplified to show one leg 82c being provided at one end of each support 82; but, in actuality, four legs 82c are provided at one end of each support 82 to make good electrical connections to the substrate 80, as shown in FIG. 19.

The high-frequency circuit component of this embodiment comprises a silicon substrate 80 as a conductive substrate and multiple high-frequency circuit elements. Specifically, the circuit elements include two mechanical switches 91, 92, two coils 93, 94 with mutually different inductance values, and a variable capacitor 95. These elements are mounted on a mounting board 81 comprising a thin dielectric film. A support mechanism 100 mechanically connects the substrate 80 to the mounting board 81 and supports the mounting board 81 in a manner by which the mounting board floats relative to the surface of the substrate 80.

The mounting board 81 comprises a silicon nitride film, and includes a level difference 81a formed around the entire peripheral edge thereof.

The support mechanism 100, as shown in FIGS. 15-17, has two support members (first film member) 82, two connecting members 84, two support members (second film member) 83, and a mounting-board support 85 that directly supports the mounting board 81. The support members 82, 83 are formed in band shapes, for example, and they warp arc-wise in their length directions. In the connecting members 84, the mounting-board support 85, and the mounting board 81, to increase rigidity, level differences 84a, 85a, 81a, respectively, are formed along edges. One end of the two support members 82 is fixed to the substrate 80 by respective legs 82c. The upper ends of the support members 83 are connected to the front ends of respective support members 82 via respective connecting members 84. The two support members 83 descend downward, and the respective front ends thereof support both ends of the mounting-board support 85. The mounting board 81 is mounted on the mounting-board support 85. Thus, the mounting-board support 85, on which the mounting board 81 is mounted, is configured to be suspended downward by the two support members 83. The mounting board 81 is fixed to the mounting-board support 85 by a connecting part 85b formed as a unit with the mounting board 81.

The warped support member 82 is a two-layer film comprising a silicon nitride film 82a laminated to a silicon oxide film 82b, as shown in FIG. 17. In contrast, the support member 83 is a two-layer film in which a silicon oxide film 83a is laminated to a silicon nitride film 83b. The support members 82, 83 both warp arc-wise due to stresses produced by the difference in thermal expansion coefficients of the silicon oxide film and silicon nitride film and due to stresses produced at the time of film formation. As shown in FIGS. 16 and 17, while the support member 82 warps to protrude away from the substrate 80, the support member 83 warps in the opposite direction from support member 82. To achieve such differential warping, the support member 82 is laminated from the substrate side in the sequence of silicon nitride film 82a then silicon oxide film 82b; the support member 83 is laminated from the substrate side in the sequence of silicon oxide film 83a then silicon nitride film 83b.

On the substrate 80 shown in FIG. 16, two thin-film three-dimensional structures 90 are mounted as stoppers adjacent one side of the mounting-board support 85 (on the side opposite the side near which the legs 82c are arranged). The three-dimensional structures 90 are positioned so that their protruding parts 90a stop and support both ends of the mounting-board support 85 in the −Y direction in FIG. 16. By supporting the mounting-board support 85 in the −Y direction in this way, it is possible to stabilize and fixedly maintain the position and orientation of the mounting board 81 even if the support members 82, 83 exhibit changes in warp status due to temperature changes.

On the substrate 80, insulating films 98, 99 (e.g., a silicon oxide film and a silicon nitride film, respectively) are laminated in sequence from the surface of the substrate 80. Respective wires (not shown), connected to the eight wires on the left side of FIG. 19, are formed between the insulating films 98, 99. Respective wires reaching the wires between the insulating films 98, 99 from parts of the mounting board 81 are formed at respective portions of the support mechanism 100, and a detailed description and drawings thereof are omitted.

The support mechanism 100 and the thin-film three-dimensional structures 90 discussed above are similar in some respects to the support mechanism and thin-film three-dimensional structures of the mirror shown in FIG. 26 of Patent Document 2. The respective methods of manufacture utilize various semiconductor-manufacturing techniques as required, such as film formation, patterning, etching, and formation and removal of sacrificial layers.

The mechanical switches 91, 92 are shown in a simplified manner in FIG. 15 but actually are configured similarly to the mechanical switch 42 shown in FIGS. 10-14 discussed above. The switch parts 91a, 92a of the mechanical switches 91, 92 shown in FIG. 19 are equivalent to the contacts 53, 54, and 58 of the mechanical switch 42, and the drive parts 91b, 92b of the mechanical switches 91, 92 are equivalent to the first and second drive electrodes 52, 58 of the mechanical switch 42.

Coils 93, 94 are shown in a simplified manner in FIG. 15, but they actually are configured similarly to the coil 2 shown in FIGS. 1-5 discussed above.

The variable condenser 95 shown in FIG. 18 comprises first drive electrodes 101a, 101b formed at the −Y surface of the mounting board 81 and a first capacitance electrode 102 between the drive electrodes. An insulating film 103, such as a silicon oxide film, covers the electrodes. A movable board 106 forms a double-sided beam having ends that are fixed to the −Y surface of the mounting board 81 via legs 104, 105. Second drive electrodes 107a, 107b and a second capacitance electrode 108 are formed at the +Y surface of the movable board 106.

The electrodes 101a, 101b, 102 and the electrodes 107a, 107b, 108 are respectively in opposition to each other. These electrodes are comprised of aluminum film. The movable board 106 comprises an insulating film such as silicon oxide film. The first drive electrodes 101a, 101b are electrically connected, and the second drive electrodes 107a, 107b are electrically connected.

The magnitude of the electrostatic force between opposing electrodes is determined by the voltages applied between the first drive electrodes 101a, 101b and the second drive electrodes 107a, 107b. Depending upon these voltages, the gap between the first drive electrodes 101a, 101b and the second drive electrodes 107a, 107b is determined, which determines the gap between the first and second capacitance electrodes 102, 108, which determines the capacitance between the capacitance electrodes. By varying the voltage applied between the first drive electrodes 101a, 101b and the second drive electrodes 107a, 107b, it is possible to vary the capacitance between the first and second capacitance electrodes 102, 108.

The variable capacitor portion 95a of the variable capacitor 95 shown in FIG. 19 corresponds to the first and second capacitance electrodes 102, 108 in FIG. 18. The drive portion 95b of the variable capacitor 95 corresponds to the first and second drive electrodes 101a, 101b, 107a, 107b.

In the mounting board 81, the electrical connections shown in FIG. 19 are made by wires that are not shown. In the example shown in FIG. 19, the configuration is such that two types of LC resonance circuits can be selected.

In this embodiment, multiple high-frequency circuit elements 91-95 are supported such that they float relative to the substrate 80. Benefits of this configuration include reduced parasitic capacitance between the coils 93, 94 and the substrate 80, which reduces electrical loss.

In this embodiment, electrical connections such as shown in FIG. 19 are made at the mounting board 81. Benefits of this configuration include reduction of parasitic capacitance between the substrate 80 and the wires between high-frequency circuit elements 91-95 connected at the mounting board 81. This, in turn, reduces electrical loss.

In this embodiment, a mounting board 81 is used, and the high-frequency circuit elements 91-95 are mounted on the mounting board 81. Thus, the mechanical strength of the assembly is increased.

The embodiments described above are exemplary. The present invention is not limited to these embodiments.

For example, the high frequency circuit element that is mounted on the mounting board may also be, for example, a resistor or a mechanical filter.

What is claimed is:

1. A high-frequency circuit component, comprising:
a substrate;
one or more high-frequency circuit elements; and
a board-like support member comprising a supporting portion and a mounting portion, at least the mounting portion comprising a thin dielectric film on which the one or more high-frequency circuit elements are mounted on the mounting portion, and the supporting portion comprising at least one leg by which the support member is coupled to a surface of the substrate such that the mounting portion, with the one or more circuit elements, floats in a cantilever manner relative to the substrate surface.

2. The high-frequency circuit component of claim 1, wherein the substrate is electrically conductive.

3. The high-frequency circuit component of claim 1, wherein each of the one or more high-frequency circuit elements and the support member comprises a respective thin film.

4. The high-frequency circuit component of claim 1, wherein the mounting portion includes a level difference extending along at least a portion of a peripheral edge of the mounting portion.

5. The high-frequency circuit component of claim 1, wherein:
the one or more high-frequency circuit elements comprise at least two high-frequency circuit elements; and
at least two high-frequency circuit elements from among the one or more high-frequency circuit elements are electrically connected on the mounting portion.

6. The high-frequency circuit component of claim 1, wherein at least one high-frequency circuit element from among the one or more high frequency circuit elements is a coil.

7. The high-frequency circuit component of claim 1, wherein at least one high-frequency circuit element from among the one or more high-frequency circuit elements is a fixed or variable capacitor.

8. The high-frequency circuit component of claim 1, wherein at least one high-frequency circuit element from among the one or more high-frequency circuit elements is a mechanical switch.

9. The high-frequency circuit component of claim 1, further comprising electrically conductive wiring on the mounting portion and supporting portion connecting the circuit elements to the substrate via the at least one leg.

10. The high-frequency circuit component of claim 1, wherein the cantilever manner by which the mounting portion floats relative to the substrate surface includes the supporting portion being arched up and away from the surface of the substrate.

11. The high-frequency circuit component of claim 10, wherein:
the supporting portion also includes a thin dielectric film;
the thin dielectric film on at least the supporting portion comprises a first dielectric layer and a second dielectric layer each having a respective stress; and
the stresses are sufficiently different to arch the supporting portion up and away from the surface of the substrate.

12. The high-frequency circuit component of claim 11, wherein the mounting portion includes a level difference extending along edges of the mounting portion to rigidify the mounting portion while allowing the supporting portion to arch.

13. The high-frequency circuit component of claim 12, wherein the level difference maintains the mounting portion as a plane.

14. The high-frequency circuit component of claim 12, wherein the level difference is defined at least in part by a protruding part.

15. The high-frequency circuit component of claim 12, wherein the level difference is defined at least in part by a recess.

16. The high-frequency circuit component of claim 1, wherein:
the supporting portion comprises at least one first portion and corresponding second portion, and a connecting portion coupling the first and second portions together;
the first portion is coupled to the substrate surface by the leg and floats in a cantilever manner relative to the substrate;
the second portion is coupled to the first portion and floats in a cantilever manner relative to the first portion; and
the mounting portion is coupled to the second portion so as to float relative to the substrate via the first and second portions.

17. The high-frequency circuit component of claim 16, further comprising at least one thin-film 3-D structure situated on the substrate surface to limit an extent of motion of the mounting portion resulting from flexure of the supporting portion relative to the substrate.

18. The high-frequency circuit component of claim 1, further comprising at least one thin-film 3-D structure situated on the substrate surface to limit an extent of motion of the mounting portion resulting from flexure of the supporting portion relative to the substrate.

* * * * *